United States Patent [19]

Roland et al.

[11] Patent Number: 5,062,939

[45] Date of Patent: Nov. 5, 1991

[54] SELECTIVE METALLIZATION OF CARBONYL-CONTAINING POLYMER FILMS

[75] Inventors: Charles M. Roland, Waldorf, Md.; Mark F. Sonnenschein, Arlington, Va.

[73] Assignee: The United States of America as represented by the Secretary of the Navy, Washington, D.C.

[21] Appl. No.: 500,979

[22] Filed: Mar. 29, 1990

[51] Int. Cl.$^5$ .................. B05D 3/06; B05D 5/12; C23C 16/00; C23C 14/00

[52] U.S. Cl. .................. 204/192.17; 427/56.1; 427/53.1; 427/96; 427/124; 427/250; 204/192.15

[58] Field of Search .................. 427/53.1, 55, 56.1, 427/123, 124, 125, 250, 96; 204/192.15, 192.17

[56] References Cited

U.S. PATENT DOCUMENTS

| | | | |
|---|---|---|---|
| 3,560,258 | 2/1971 | Brisbane | 219/121.63 |
| 4,109,052 | 8/1978 | Anderson | 427/124 |
| 4,387,133 | 6/1983 | Ichikawa et al. | 427/124 |
| 4,419,399 | 12/1983 | Ichikawa et al. | 427/124 |
| 4,496,607 | 1/1985 | Mathias | 427/53.1 |
| 4,615,907 | 10/1986 | Boeke et al. | 427/53.1 |
| 4,720,401 | 1/1988 | Ho et al. | 427/124 |
| 4,743,463 | 5/1988 | Ronn et al. | 427/53.1 |
| 4,844,851 | 7/1989 | Hotta et al. | 427/124 |
| 4,879,176 | 11/1989 | Ouderkirk et al. | 427/55 |

*Primary Examiner*—Shrive Beck
*Assistant Examiner*—Marianne L. Padgett
*Attorney, Agent, or Firm*—Thomas E. McDonnell; Barry A. Edelberg

[57] ABSTRACT

Carbonyl-containing polymer films, such as PET, are selectively metallized by contacting the films with a layer or film of metal, such as aluminum, and then irradiating selected portions of the surface of the film with infrared radiation thereby heating those selected portions of the film. The metal on or opposite the irradiated portions of the surface adhere to the film. The remaining metal may be readily removed. The process provides surprisingly good spatial resolution. The present process is particularly useful in the production of microcontacts for circuit boards.

11 Claims, No Drawings

SELECTIVE METALLIZATION OF CARBONYL-CONTAINING POLYMER FILMS

BACKGROUND OF THE INVENTION

1. Field of the Invention

The present invention relates generally to the metallization of polymers and more specifically to the metallization of carbonyl-containing polymers.

2. Description of the Prior Art

Because of the excellent physical and chemical properties of carbonyl-containing polymers such as poly(ethylene terephthalate) (i.e., PET), metallization (selective or otherwise) has been an object of keen interest to manufacturing. The major problem associated with the process has been achieving sufficient adhesion between the film and the metal to minimize delamination. Treatments usually involve immersion of the film in acidic or basic baths for varying amounts of time followed by one of several electroless plating processes using complex solution chemistry and sensitive balancing of electromotive force and weak metal complexation in solution. The pretreatment is believed to result in the breaking of carbonyl bonds yielding reactive carboxyl and hydroxyl groups.

Other techniques for applying metal to carbonyl-containing films such as PET involve spraying special adhesives directly on the film prior to electroless deposition and also glow discharge pretreatment followed by chemical vapor deposition.

Selective metallization has been achieved in the prior art using the general techniques described above, coupled additionally with the poisoning of desired areas to the metallization process, for example by the incorporation of impurities by various means. These prior art techniques are complex and require the use of various extraneous reagents.

Specifically, a patent by Aviram et al. (U.S. Pat. No. 4,440,801) describes the selective metalization of semicrystalline PET using high intensity, short wavelength ultra-violet laser irradiation through a lithographic mask, followed by chemical treatment in an ammonia bath, followed by electroless deposition of metal using standard techniques. Only in those areas exposed to the UV light was metal deposited from the electroless plating bath.

Rubner and Cukor (U.S. Pat. No. 4,486,463) describe a method for selective metallization of poly(-phenylenesulfide)(PPS). Practice of their technique requires irradiation of amorphous PPS through a lithographic mask with an infra-red light source, chemical treatment, doping of amorphous regions of the polymer with a metallization poison, followed by metalliztion of the crystalline PPS using conventional electroless techniques.

Another technique for electroless deposition of metal onto a polymer substrate is described by Blum et al (U.S. Pat. No. 4,451,503 wherein a high intensity, short wavelength U.V. source is used to decompose metal carbonyl compounds into the zero valent metal state which then condense onto a polymer substrate lying in close juxtaposition. Selectivity of the metallization process occurs when the exciting light is scanned in a particular pattern.

Brown et al. (J. Appl. Poly. Sci. 35, 1988, 279-297.) report a method for depositing aluminum on PET with very strong metalpolymer adhesion. In this process the polymer is first subjected to the radiative effects of a glow discharge, and then metal vapor deposited to a thickness of tens of nanometers.

Warshawsky and Upson (Polymer, 30, 1989, 972-973.) describe a technique for the electroless deposition of metal on polymer surfaces whereby the polymer is activated by its soaking in a palladium catalyst solution, the reduction of the catalyst with one of several suggested agents, followed by the immersion of the polymer into an electroless plating bath.

SUMMARY OF THE INVENTION

It is an object of the present invention to selectively metallize a polymer film.

It is another object of the present invention to obtain high resolution metallized images on a polymer film.

It is yet another object of the present invention to selectively metallize a polymer film without requiring the use of extraneous reagents or extra processing steps.

These and other objects are accomplished by contacting a metal film with, or forming a thin layer of metal on, a carbonyl-containing polymer substrate. The image is then formed by exposing selected sections of the coated or overlaid substrate to infrared radiation. The spatial distribution of the radiation impinging on the film is controlled either by a mask or by translation of a well-defined beam of infrared light. The metal in the exposed area adheres to the film, while the metal in the non-exposed area may be easily removed.

DETAILED DESCRIPTION OF THE PREFERRED EMBODIMENTS

In one embodiment of the present invention, a metal film is placed in intimate contact (good thermal contact) with a film of a carbonyl-containing polymer. The film may be crystalline or amorphous initially, and plasma pretreatment of the film is optional. The metal can alternatively be deposited by vapor deposition. Infra-red radiation, produced for example by a $CO_2$ laser, is impinged directly onto the polymer film surface (the metal is on the backside). The spatial distribution of the radiation is controlled by either the presence of a mask between the radiation source and the film, or by translation of a well defined beam of the radiation. After heating of the polymer film by exposure to the infra-red light (the required temperature being a function of the film's initial degree of crystallinity), the metal in the non-irradiated areas is removed, by suitable means such as peeling or brushing away. The metal located in the regions of film that attain a high temperature remains on the film. With PET as the substrate, the adhesion which develops by this process has been found to exceed the cohesive strength of the polymer.

An alternative procedure is to sputter or vapor deposit a very thin layer (for example about 100 Å) of the metal, either as a continuous film or as discrete islands of metal over the surface of the polymer. Sputtering or vapor deposition of very thin films will inherently tend to give spotty coverage, i.e., discontinuous films, if the extent of the depositioning is limited. For sufficiently thin or discontinuous coatings, this metallized surface can be the side of the polymer film which is irradiated (contrary to the procedure described in the preceding paragraph). The radiation still reaches the film either through the holes in the metal coating or directly through the metal (which is thin enough to permit some transmission). The metal in the irradiated regions becomes bonded to the film, while the metal deposited in regions that are not irradiated (and thus remain cool) can be brushed away easily. Subsequently additional metal can be deposited onto the film by electroless plating. During this second deposition step, the metal will preferentially accumulate on the regions containing the adhered metal. A thicker, more continuous selective metal pattern is thus obtained. Because the infrared radiation is applied through the metal, this embodiment can be used to produce a polymer film having the same metal pattern deposited on each surface by vapor depositing or sputtering the metal on each surface of the polymer film prior to irradiation. Only one surface would need to be irradiated, since the mobility of the carboxyl groups would be increased throughout the thickness of the polymer film, thereby binding the metal to both sides of the polymer film.

For optimal adhesion, the metal to be selectively deposited according to the present invention is an oxide-forming metal, such as aluminum, copper, nickel, iron, zinc, and silver. Oxide forming metals, when deposited according to the present invention, form a bond with the polymer which can be stronger than the polymer's inherent strength. The method of the present invention has been used to successfully deposit aluminum and copper and, albeit with somewhat inferior bonding, gold. Other transition metals may be used.

While it is not desired to be bound by theory, it is believed that exposure of an area of the polymer film preferentially heats that area. This local heated increases the mobility of the polymer chains within that area. Apparently, the increased mobility permits the carboxyl group to orient in a manner which allows binding of the metal or an oxide on a surface of the metal to the film through the carbonyl function of the polymer. The high spatial selectivity of the process according to the present invention arises because the process is thermally initiated, not photo-initiated. Therefore, the resolution obtainable according to the present invention is not limited by diffraction of the incident light beam. Of course, the wavelength to which the polymer film is exposed should be one which is absorbed by the polymer film.

When the metal resides on the irradiated side of the film, the thickness of a metal layer which can be sputtered on the polymer for use in the present invention is limited by the maximum coverage at which there remains sufficient throughput of radiation. Towards this end the sputtered layer must be thin or have a discontinuous character. The thickness of a metal film placed over the polymer film is limited by the percentage of the infrared energy which can be transmitted through the metal film. For the metallization of PET film, the metal film should permit the transmission of at least about 5% of infrared radiation having a wavelength of 10.6 $\mu$m, or, at a different wavelength, the transmission of an equivalent amount of absorbable power. The infrared wavelength can be any having the ability to heat the polymer film to be coated. At least insofar as transmissibility is concerned, the thickness of the metal layer is not critical in the embodiment where the surface of the polymer opposite the metal is irradiated.

In general, the infrared radiation should have sufficient power to heat the exposed areas of the polymer film to the extent that they become flexible. Apparently, once these areas of the film become flexible, the carbonyl groups can rotate to react with the metal or metal oxide of the metal layer or metal film. If the polymer film is initially amorphous, the infrared power striking the exposed areas should be approximately equal to that required to raise the temperature of the exposed areas about 30° C. above the glass transition temperature of the polymer up to the temperature where significant stress flow can occur (typically the melting point) or the decomposition temperature of the polymer. If the polymer film is initially crystalline, the infrared radiation striking the exposed areas must heat the exposed areas to a temperature above the polymer melting point. If the exposed areas are heated sufficiently above the polymer's glass transition temperature (which will invariably be the case when they must be heated to above the melting point), any substantial flow must be prevented. Such flow or deformation will result from the presence of stresses in or on the film; significant levels of stress can arise, for example, simply from gravity. Such flow can be prevented by using a sufficiently thick polymer film (the exact thickness required can be determined empirically without undue experimentation), or by sandwiching the polymer film/metal structure between plates, the plate on the side of the polymer film to be exposed to the infrared radiation preferably being highly transparent to that radiation.

By way of example, for poly(ethylene terephthalate) films which are initially partially crystalline, a temperature of at least 250° C. must be achieved by the irradiation. If the PET film is amorphous, temperatures as low as 120° C. are sufficient for obtaining metal adhesion.

The polymer film metallized according to the present invention is preferably a carbonyl group-containing polymer, such as a polyester. It is further preferable, but not necessary, that if the polymer is crystallizable, it be quenchable into an amorphous state; i.e., capable of being cooled from above its melting point to room temperature without crystallization. The present invention is especially useful for the selective metallization of polyethylene terephthalate films.

The resolution, or fineness, of radiation heating of the substrate is not limited by diffraction of the incident light, since this is a thermal process. Elementary heat flow considerations would suggest that the resolution will be severely hindered by thermal diffusion away from the directly heated regions. Surprisingly, however, it has been found that the resolution achievable is equivalent to the fineness of radiation pattern impinging on the material.

It is known that exposure of PET surfaces to plasma will increase functionality and thus improve bonding to aluminum. That treatment may be similarly effective when employed with other carbonyl-containing polymer films. The present process obviously might benefit from such pretreatment of the polymer films, although it has been demonstrated that such treatment is not required.

Having described the invention, the following examples are given to illustrate specific applications of the invention including the best mode now known to perform the invention. These specific examples are not intended to limit the scope of the invention described in this application.

EXAMPLE

Example 1

PET film was placed on a thin film of aluminum (thicknesses were 0.005″ and 0.001″ respectively). For 45 seconds a 1.4 watt $CO_2$ laser beam was passed through a mask and the resulting radiation impinged on the PET side of the pair of films. After this the aluminum was peeled away from the PET. The metal came off the polymer film only where the laser light had been blocked by the mask. In the other regions the film adhered to the PET, resulting in a pattern of metallization exactly corresponding to the image on the mask. Details as small as one micron were obtained.

Example 2

A mask comprised of an aluminum pattern on a GaAs substrate was placed in direct contact with a PET film, with the metallized side of the mask against the polymer. The output of the $CO_2$ laser was directed onto the mask (2.0 watts for 36 seconds). After this exposure the mask was lifted away. The region of the mask through which the laser beam had passed was observed in the microscope to be now free of aluminum. This metal pattern had bonded to the surface of the PET. The metal was well adhered and could not be removed with Scotch TM brand cellophane adhesive tape.

Example 3

A mask comprised of a gold pattern on a GaAs substrate was placed in direct contact with a PET film, with the metallized side of the mask against the polymer. The output of the $CO_2$ laser was directed onto the mask (2.7 watts for 40 seconds). After this exposure the mask was lifted away. The region of the mask through which the laser beam had passed was observed in the microscope to be now free of gold. This metal pattern was now bonded to the surface of the PET, although the adhesion was found to be inferior to that obtained in example (B) above.

Example 4

A PET film was placed on a thin copper film (film thickness were 0.0005 inches and 0.010 inches respectively). The PET film was heated while in contact with the copper. After this treatment the copper film could not be removed from the polymer. Attempts to do so resulted in rupture of the polymer film.

Example 5

A very thin layer (about 250 Å) of gold was sputtered onto PET film. The deposition was minimized such that the gold was present on the surface of the polymer as discrete islands. The side of the polymer film with the gold coated surface was irradiated directly with 3.2 watts of IR radiation for 50 seconds. The metal in the irradiated regions became bonded to the PET film, while the metal deposited on unirradiated regions was readily removed by simple brushing of the surface. A finely detailed metallized pattern was thus produced on the polymer film. The edge acuity of the metallized lines was equivalent to that of the mask ($+/-0.5$ μm).

The present invention is a single step process that involves no extraneous reagents (e.g., etchants, reactants, or washes), and moreover takes advantage of the exceptional spatial resolution obtained in microlithography of polyester films such as PET (see Sonnenschein et al, U.S. patent application Ser. No. 07/422,723, filed Oct. 16, 1989, incorporated herein by reference). Adhesion of aluminum and copper to the PET have been found to pass a standard cellophane adhesive tape test, described above, used in the art to assess adhesion for these applications.

The process of the present invention can produce a variety of useful materials. The present invention is particularly suited to the production of microcontacts for printed circuit boards.

Obviously, many modifications and variations of the present invention are possible in light of the above teachings. It is therefore to be understood that, within the scope of the appended claims, the invention may be practiced otherwise than as specifically described.

What is claimed is:

1. A method of selectively metallizing a carbonyl-containing polymer, comprising the steps of:
   (a) contacting a surface of a carbonyl-containing polymer with a layer or film of a metal to be selectively deposited thereon;
   (b) exposing a selected area on the surface of said polymer to infrared radiation of a wavelength absorbed by said polymer and having sufficient power to significantly increase the flexibility of said polymer in said exposed area without significantly increasing stress flow of said polymer, while leaving another area of said surface of said polymer unirradiated, whereby any of said metal on or opposite said irradiated areas of said polymer binds to said polymer; and
   (c) removing any of said metal layer or film which has not bound to said polymer after step (b).

2. The method of claim 1, wherein said polymer is a polyester.

3. The method of claim 2, wherein said polymer is poly(ethylene terephthalate).

4. The method of claim 2, wherein said metal is an oxide former.

5. The method of claim 3, wherein said metal is aluminum, copper or gold.

6. The method of claim 5, wherein said metal is aluminum or copper.

7. The method of claim 2, wherein said polymer is initially amorphous and the irradiated area of the surface of said polymer is heated to at least about 30° C. above its glass transition temperature.

8. The method of claim 2, wherein said polymer is initially crystalline and the irradiated area of the surface of said polymer is heated to above the melting point of said polymer.

9. The method of claim 1, wherein said polymer is capable of being amorphous or crystalline at room temperature.

10. The method of claim 1, wherein said metal film or layer comprises a film of layer in intimate contact with said polymer and said exposed surface of said polymer is opposite the surface of said polymer contacting said metal film.

11. The method of claim 1, wherein said contacting step comprises the step of sputtering or vapor depositing said metal film or layer sufficiently thinly so that about 5% of infrared radiation having a wavelength of 10.6 μm or an equivalent amount of power can be transmitted through said metal film or layer.

* * * * *